(12) United States Patent
Solski et al.

(10) Patent No.: US 8,736,399 B2
(45) Date of Patent: May 27, 2014

(54) TRIPLEXER TOPOLOGY

(75) Inventors: Piotr M. Solski, Carrigtwohill (IE);
Stephen P. Jones, Ballyviniter (IE);
David A. Hayes, Kinsale (IE)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 367 days.

(21) Appl. No.: 13/080,945

(22) Filed: Apr. 6, 2011

(65) Prior Publication Data

US 2012/0256701 A1    Oct. 11, 2012

(51) Int. Cl.
*H03H 7/46* (2006.01)
(52) U.S. Cl.
USPC ............................. 333/132; 333/126; 333/129
(58) Field of Classification Search
USPC .......................................... 333/126, 129, 132
See application file for complete search history.

(56) References Cited

U.S. PATENT DOCUMENTS

| | | | | |
|---|---|---|---|---|
| 5,548,255 A * | 8/1996 | Spielman | ....................... | 333/132 |
| 6,768,399 B2 * | 7/2004 | Uriu et al. | ....................... | 333/204 |
| 2006/0053462 A1 * | 3/2006 | Albag et al. | ................... | 725/126 |
| 2011/0016704 A1 * | 1/2011 | Yang | ................... | 29/605 |

FOREIGN PATENT DOCUMENTS

| | | | |
|---|---|---|---|
| DE | 4309715 C1 | * | 3/1994 |
| JP | 62157317 A | * | 7/1987 |
| JP | 2006332980 A | * | 12/2006 |
| KR | 2008102518 A | * | 11/2008 |

* cited by examiner

*Primary Examiner* — Robert Pascal
*Assistant Examiner* — Kimberly Glenn
(74) *Attorney, Agent, or Firm* — Christopher P. Maiorana, PC

(57) ABSTRACT

An apparatus comprising a first filter, a second filter, a third filter, and a fourth filter. The first filter may comprise a low pass filter having a first bandwidth and configured to present a first output signal in response to an input signal received at an input port of the apparatus. The second filter may comprise a high pass filter having a second bandwidth and configured to present a second output signal in response to the input signal received at the input port of the apparatus. The third filter may comprise a low pass filter having a third bandwidth and configured to present a third output signal in response to the second output signal. The fourth filter may comprise a high pass filter having a fourth bandwidth and configured to present a fourth output signal in response to the second output signal.

20 Claims, 7 Drawing Sheets

TRIPLEXER TOPOLOGY

FIELD OF THE INVENTION

The present invention relates to communications generally and, more particularly, to a method and/or apparatus for implementing a novel triplexer topology.

BACKGROUND OF THE INVENTION

Referring to FIG. 1, a block diagram of a standard triplexer 10 is shown. The triplexer 10 has a topology consisting of a low pass filter 12, a band pass filter 14, and a high/band pass filter 16 operating in parallel. All of the filters operate at different frequency bands with often very narrow transition frequency bands. A problem that arises with the standard configuration is difficulty in designing a band pass filter that presents a high out-of-band impedance that has negligible effect on the neighboring filters. Real world band pass filters have dips in return loss that in turn create an insertion loss dip in neighboring filters. Also, a complex interaction occurs between the three neighboring filters that makes the overall design very challenging. Overcoming the problem is crucial in order to obtain the desired, high performance overall frequency response of a triplexer.

SUMMARY OF THE INVENTION

The present invention concerns an apparatus comprising a first filter, a second filter, a third filter, and a fourth filter. The first filter may comprise a low pass filter having a first bandwidth and configured to present a first output signal in response to an input signal received at an input port of the apparatus. The second filter may comprise a high pass filter having a second bandwidth and configured to present a second output signal in response to the input signal received at the input port of the apparatus. The third filter may comprise a low pass filter having a third bandwidth and configured to present a third output signal in response to the second output signal. The fourth filter may comprise a high pass filter having a fourth bandwidth and configured to present a fourth output signal in response to the second output signal.

The objects, features and advantages of the present invention include providing a method and/or apparatus for implementing a novel triplexer topology that may (i) replace a band pass filter with a cascade of high and low pass filters, (ii) provide high and low pass filters that present sufficiently high impedance at respective low and high frequency ends with negligible effect on neighboring filters, (iii) arrange filters on a printed circuit board such that each filter is orthogonal to adjacent filters, (iv) arrange inductors in each filter such that each inductor is orthogonal to adjacent inductors with respect to an axis through the windings of each inductor, and/or (v) implement one or more filter inductors as metal traces on a printed circuit board.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
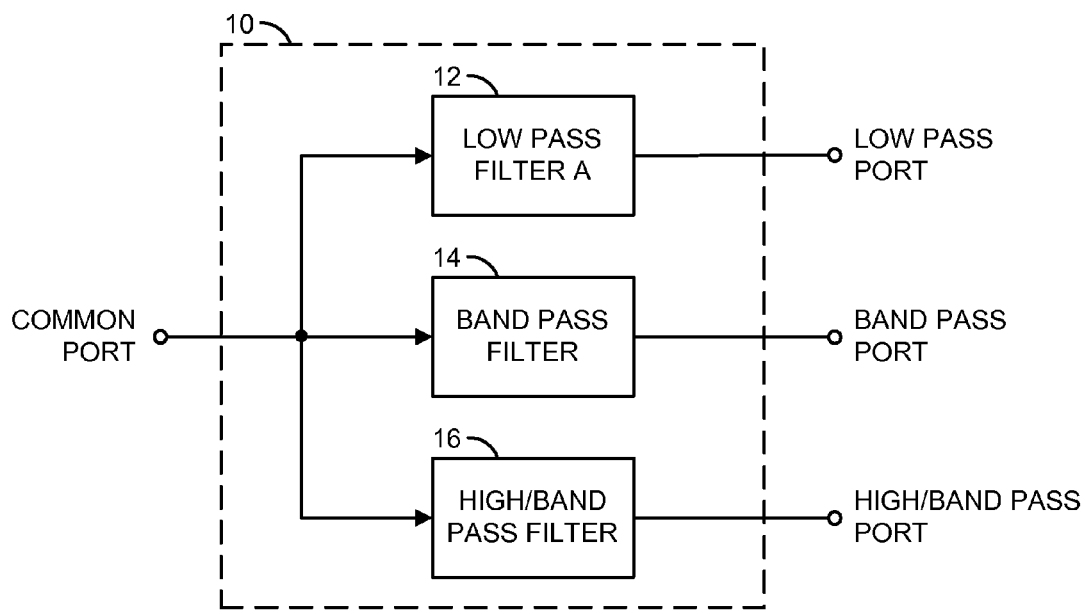
FIG. 1 is a block diagram of a standard triplexer.
Figure 1:
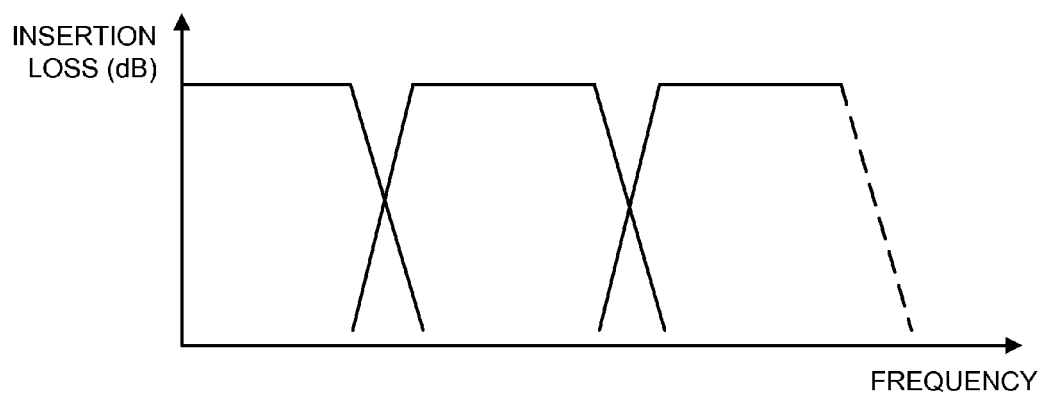
Figure 2:
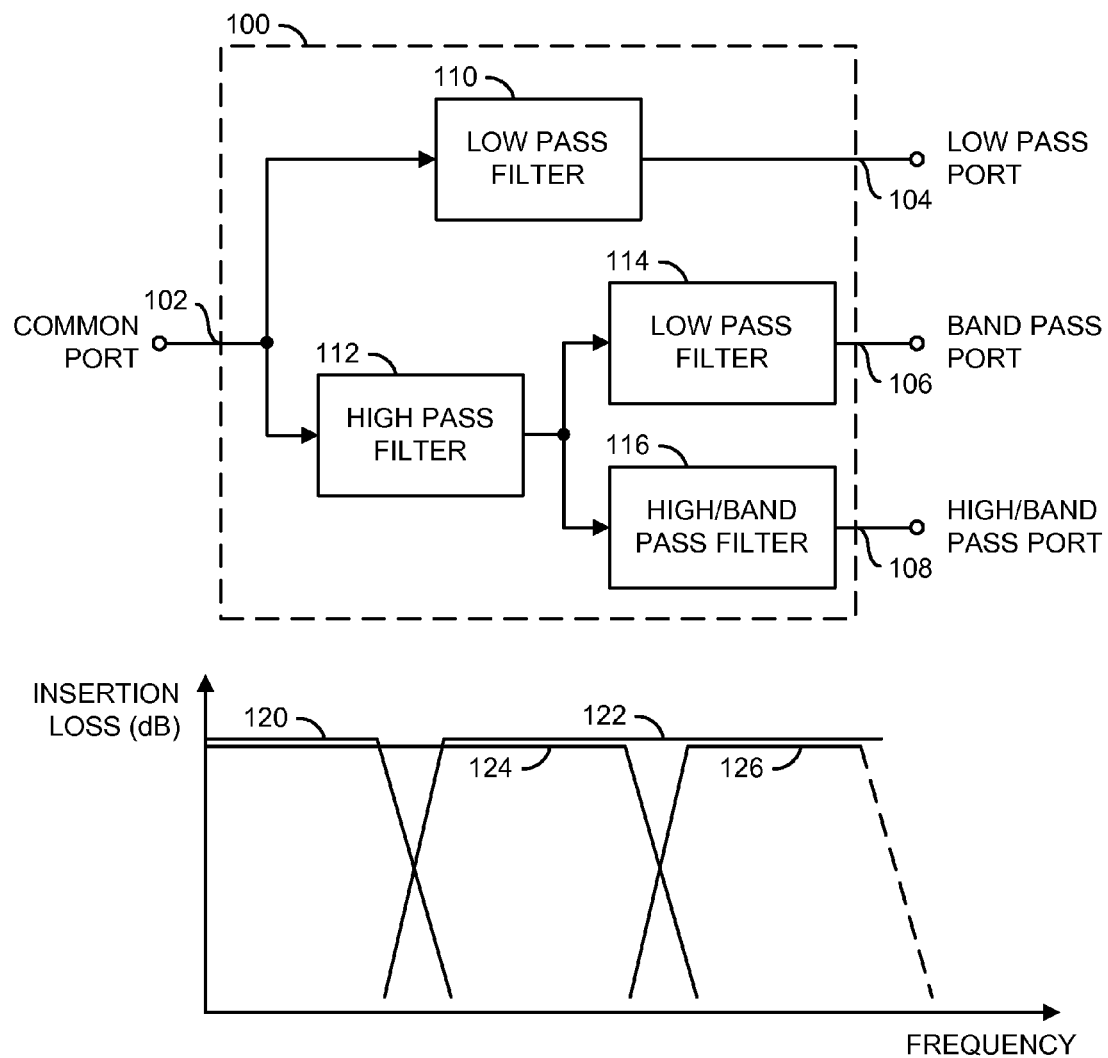
FIG. 2 is a block diagram illustrating a triplexer implemented in accordance with an example embodiment of the present invention.

Referring to FIG. 2, a block diagram of a circuit 100 is shown illustrating an example implementation of a triplexer in accordance with a preferred embodiment of the present invention. The circuit 100 generally provides a triplexer topology that replaces the band pass filter of a standard triplexer with a cascade of high and low pass filters. The cascade of high and low pass filters in accordance with the present invention generally relaxes the design criteria for individual filters. The high pass and low pass filters may present sufficiently high impedance at respective low and high frequency ends with negligible effect on the neighboring filter. The high pass and low pass filters are generally easier to design than a band pass filter that presents high impedance at both out-of-band frequency ends.

The circuit 100 may have a common port 102 that may receive an input signal, a low pass port 104 that may present a first output signal, a band pass port 106 that may present a second output signal, and a high/band pass port 108 that may present a third output signal. The first, second, and third output signals generally contain different frequency bands. In one example, the circuit 100 may comprise a block (or circuit) 110, a block (or circuit) 112, a block (or circuit) 114, and a block (or circuit) 116. The circuit 110 may implement a low pass filter having a first bandwidth 120. The circuit 112 may implement a high pass filter having a second bandwidth 122. The first bandwidth 120 may cover a lower portion of the overall bandwidth of the circuit 100. The second bandwidth 122 may cover an upper portion of the overall bandwidth of the circuit 100.

The circuit 114 may implement a low pass filter having a third bandwidth 124. The circuit 116 may implement a high pass filter having a fourth bandwidth 126. The third bandwidth generally encompasses the frequency range of the first bandwidth 120. The fourth bandwidth 126 generally encompasses an upper portion of frequencies of the second bandwidth 122. The four filters 110, 112, 114, and 116 generally operate together to divide the frequency components of a signal received at the common port 102 into three separate bands. The three separate bands may be presented at the low pass port 104, the band pass port 106, and the high/band pass port 108.

The signal received at the common port 102 may be presented to an input of the circuit 110 and an input of the circuit 112. An output of the circuit 110 may be presented at the low pass port 104. An output of the circuit 112 may be presented to an input of the circuit 114 and an input of the circuit 116. An output of the circuit 114 may be presented at the band pass port 106. In one example, an output of the circuit 116 may be presented at the high/band pass port 108. In another example, an optional third low pass filter 118 (described below in connection with FIG. 4) may be implemented between the output of the circuit 116 and the high/band pass port 108. In one example, the third low pass filter 118 may be implemented with a cut-off frequency of about 2.4 GHz to provide an upper limit on the range of frequencies presented at the high/band pass port 108 (e.g., illustrated by a dotted line in FIG. 2).

Figure 3:
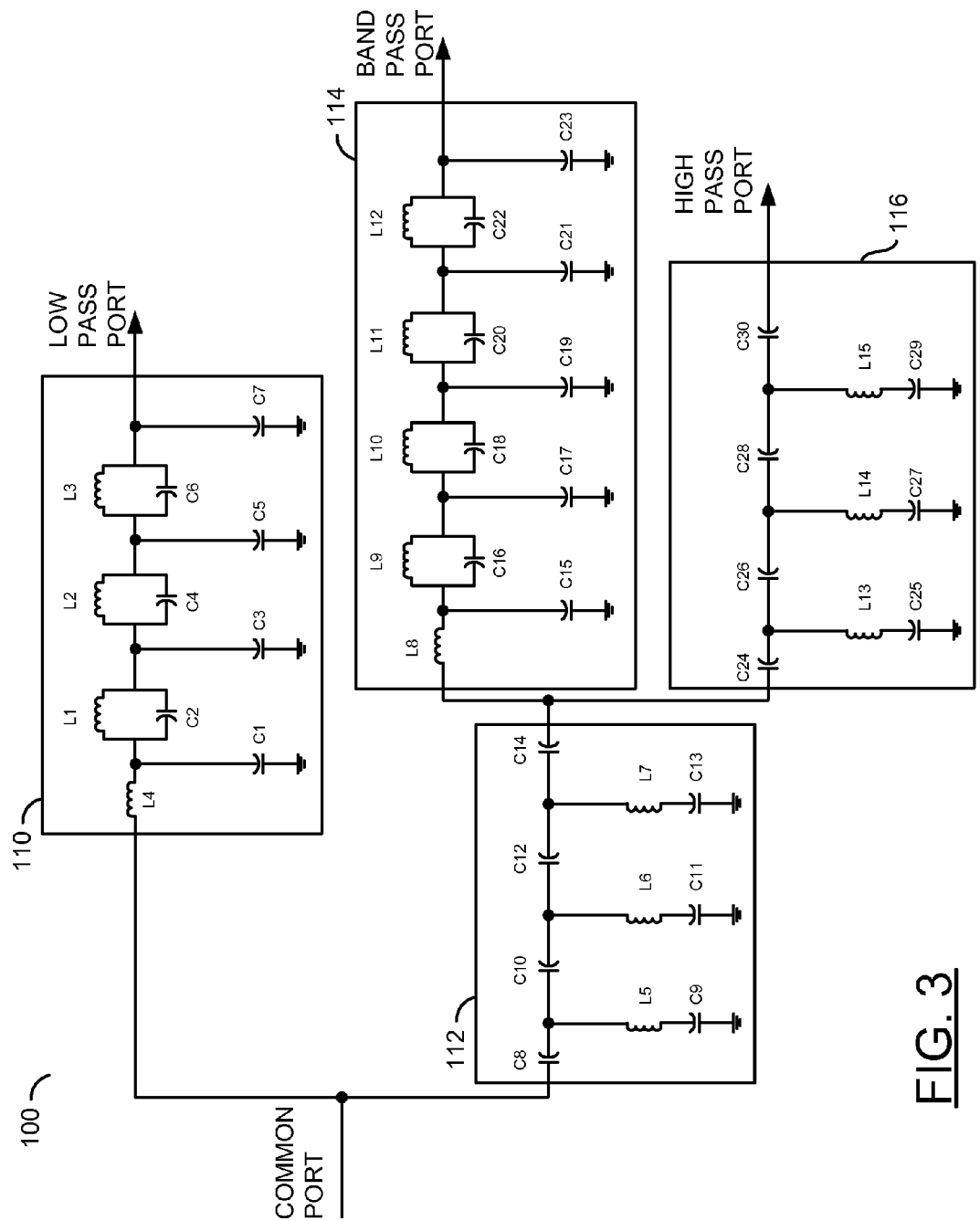
FIG. 3 is a circuit diagram illustrating an example implementation of the triplexer of FIG. 2.

Referring to FIG. 3, a circuit diagram is shown illustrating an example implementation of the circuit 100 of FIG. 2. In one example, the circuit 110 may comprise an inductor L1, an inductor L2, an inductor L, an inductor L4, a capacitor C1, a capacitor C2, a capacitor C3, a capacitor C4, a capacitor C5, a capacitor C6, and a capacitor C7. The signal received at the common port 102 may be presented to a first terminal of the inductor L4. A second terminal of the inductor L4 may be connected to a first terminal of the inductor L1, a first terminal of the capacitor C1, and a first terminal of the capacitor C2. A second terminal of the capacitor C1 may be tied to a power supply ground potential. A second terminal of the inductor L1 and a second terminal of the capacitor C2 may be connected to a first terminal of the inductor L2, a first terminal of the capacitor C3, and a first terminal of the capacitor C4. A second terminal of the capacitor C3 may be tied to the power supply ground potential. A second terminal of the inductor L2 and a second terminal of the capacitor C4 may be connected to a first terminal of the inductor L3, a first terminal of the capacitor C5, and a first terminal of the capacitor C6. A second terminal of the capacitor C5 may be tied to the power supply ground potential. A second terminal of the inductor L3 and a second terminal of the capacitor C6 may be connected to a first terminal of the capacitor C7 and the low pass port 104. A second terminal of the capacitor C7 may be tied to the power supply ground potential.

In one example, the circuit 112 may comprise an inductor L5, an inductor L6, an inductor L7, a capacitor C8, a capacitor C9, a capacitor C10, a capacitor C11, a capacitor C12, a capacitor C13, and a capacitor C14. The signal received at the common port 102 may be presented to a first terminal of the capacitor C8. A second terminal of the capacitor C8 may be connected to a first terminal of the inductor L5 and a first terminal of the capacitor C10. A second terminal of the inductor L5 may be connected to a first terminal of the capacitor C9. A second terminal of the capacitor C9 may be connected to the power supply ground potential. A second terminal of the capacitor C10 may be connected to a first terminal of the inductor L6 and a first terminal of the capacitor C12. A second terminal of the inductor L6 may be connected to a first terminal of the capacitor C11. A second terminal of the capacitor C11 may be connected to the power supply ground potential. A second terminal of the capacitor C12 may be connected to a first terminal of the inductor L7 and a first terminal of the capacitor C14. A second terminal of the inductor L7 may be connected to a first terminal of the capacitor C13. A second terminal of the capacitor C13 may be connected to the power supply ground potential. An output signal of the circuit 112 may be presented at a second terminal of the capacitor C14. The relative positions of inductors L5, L6, and L7 and the respective serially connected capacitors C9, C11 and C13 may exchanged. For example, the first terminals of the inductors L5, L6, and L7 may be tied to the power supply ground potential and the second terminals of the capacitors C9, C11 and C13 may be connected to the respective terminals of the capacitors C8, C10, C12, and C14.

In one example, the circuit 114 may comprise an inductor L8, an inductor L9, an inductor L10, an inductor L11, an inductor L12, a capacitor C15, a capacitor C16, a capacitor C17, a capacitor C18, a capacitor C19, a capacitor C20, a capacitor C21, a capacitor C22, and a capacitor C23. The signal presented at the second terminal of the capacitor C14 may be presented to a first terminal of the inductor L8. A second terminal of the inductor L4 may be connected to a first terminal of the inductor L9, a first terminal of the capacitor C15, and a first terminal of the capacitor C16. A second terminal of the capacitor C15 may be tied to the power supply ground potential. A second terminal of the inductor L9 and a second terminal of the capacitor C16 may be connected to a first terminal of the inductor L10, a first terminal of the capacitor C17, and a first terminal of the capacitor C18. A second terminal of the capacitor C17 may be tied to the power supply ground potential. A second terminal of the inductor L10 and a second terminal of the capacitor C18 may be connected to a first terminal of the inductor L11, a first terminal of the capacitor C19, and a first terminal of the capacitor C20. A second terminal of the capacitor C19 may be tied to the power supply ground potential. A second terminal of the inductor L11 and a second terminal of the capacitor C20 may be connected to a first terminal of the inductor L12, a first terminal of the capacitor C21, and a first terminal of the capacitor C22. A second terminal of the capacitor C21 may be tied to the power supply ground potential. A second terminal of the inductor L12 and a second terminal of the capacitor C22 may be connected to a first terminal of the capacitor C23 and the band pass port 106. A second terminal of the capacitor C23 may be tied to the power supply ground potential.

In one example, the circuit 116 may comprise a high pass filter formed by an inductor L13, an inductor L14, an inductor L15, a capacitor C24, a capacitor C25, a capacitor C26, a capacitor C27, a capacitor C28, a capacitor C29, and a capacitor C30. The signal presented at the second terminal of the capacitor C14 may be presented to a first terminal of the capacitor C24. A second terminal of the capacitor C24 may be connected to a first terminal of the inductor L13 and a first terminal of the capacitor C26. A second terminal of the inductor L13 may be connected to a first terminal of the capacitor C25. A second terminal of the capacitor C25 may be connected to the power supply ground potential. A second terminal of the capacitor C26 may be connected to a first terminal of the inductor L14 and a first terminal of the capacitor C28. A second terminal of the inductor L14 may be connected to a first terminal of the capacitor C27. A second terminal of the capacitor C27 may be connected to the power supply ground potential. A second terminal of the capacitor C28 may be connected to a first terminal of the inductor L15 and a first terminal of the capacitor C30. A second terminal of the inductor L15 may be connected to a first terminal of the capacitor C29. A second terminal of the capacitor C29 may be connected to the power supply ground potential. A second terminal of the capacitor C30 may be connected to a first terminal of the capacitor C31 and the High/band port 108. A second terminal capacitor C31 may be connected to the power supply ground potential. The relative positions of inductors L13, L14, and L15 and the respective serially connected capacitors C25, C27 and C29 may exchanged. For example, the first terminals of the inductors L13, L14, and L15 may be tied to the power supply ground potential and the second terminals of the capacitors C25, C27 and C29 may be connected to the respective terminals of the capacitors C24, C26, C28, and C30.

Figure 4:
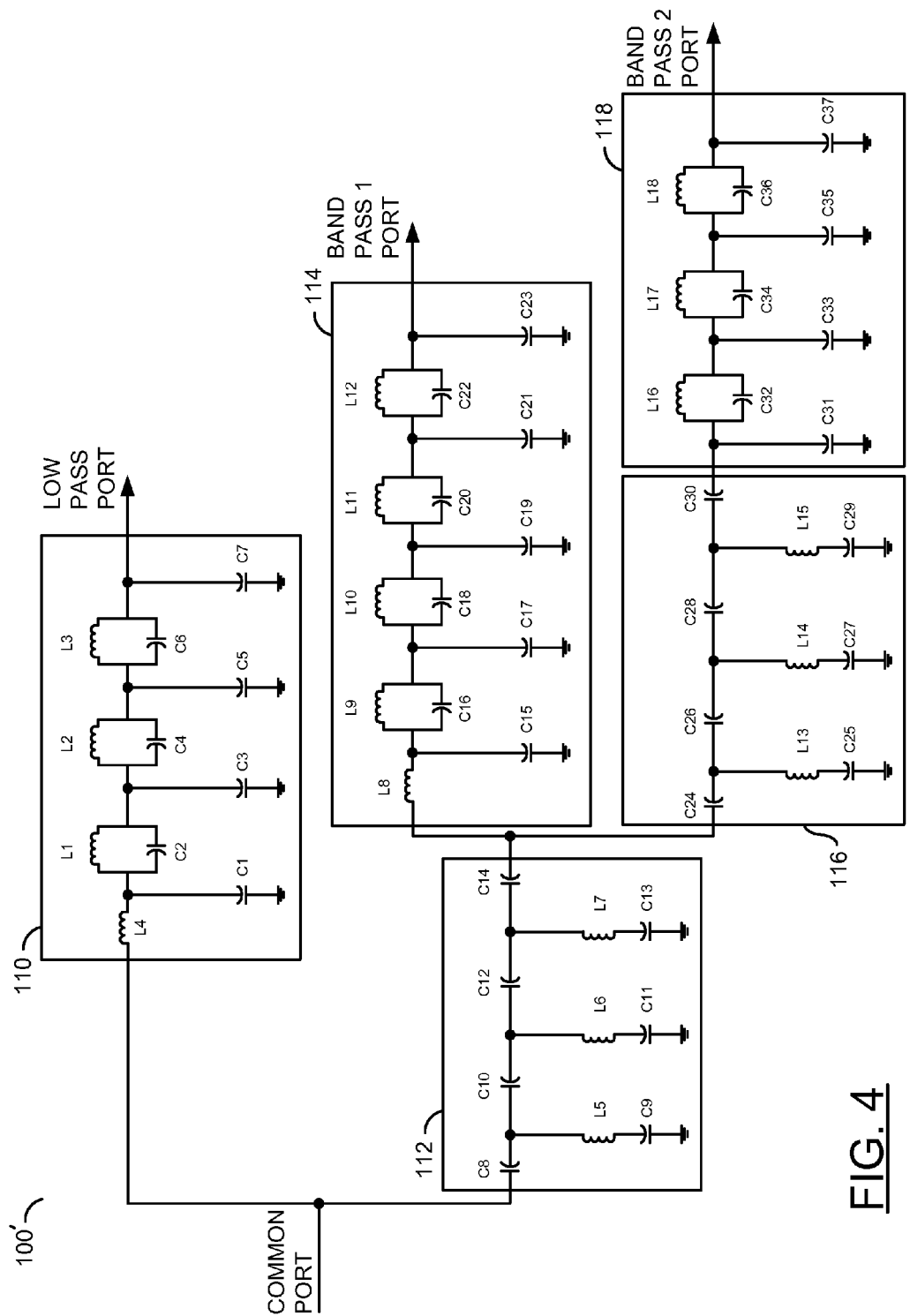
FIG. 4 is a circuit diagram illustrating another example implementation of the triplexer of FIG. 2.

Referring to FIG. 4, a circuit diagram of a circuit 100' is shown illustrating another example implementation of the circuit of FIG. 2. The circuit 100' may be implemented similarly to the circuit of FIG. 3, except that the circuit 118 may be implemented to provide an additional low pass filter between the circuit 116 and the high/band pass port 108. In one example, the circuit 118 may comprise an inductor L16, an inductor L17, an inductor L18, a capacitor C31, a capacitor C32, a capacitor C33, a capacitor C34, a capacitor C35, a capacitor C36, and a capacitor C37. In one example, the inductors L16, L17, and L18 may be implemented as metal traces on a printed circuit board.

The second terminal of the capacitor C30 in the circuit 116 may be connected to a first terminal of the capacitor C31, a first terminal of the inductor L16, and a first terminal of the capacitor C32. A second terminal of the capacitor C31 may be connected to the power supply ground potential. A second terminal of the inductor L16 and a second terminal of the capacitor C32 may be connected to a first terminal of the inductor L17, a first terminal of the capacitor C33, and a first terminal of the capacitor C34. A second terminal of the capacitor C33 may be tied to the power supply ground potential. A second terminal of the inductor L17 and a second terminal of the capacitor C34 may be connected to a first terminal of the inductor L18, a first terminal of the capacitor C35, and a first terminal of the capacitor C36. A second terminal of the capacitor C35 may be tied to the power supply ground potential. A second terminal of the inductor L18 and a second terminal of the capacitor C36 may be connected to a first terminal of the capacitor C37 and the high/band pass port 108. A second terminal of the capacitor C37 may be tied to the power supply ground potential.

Figure 5:
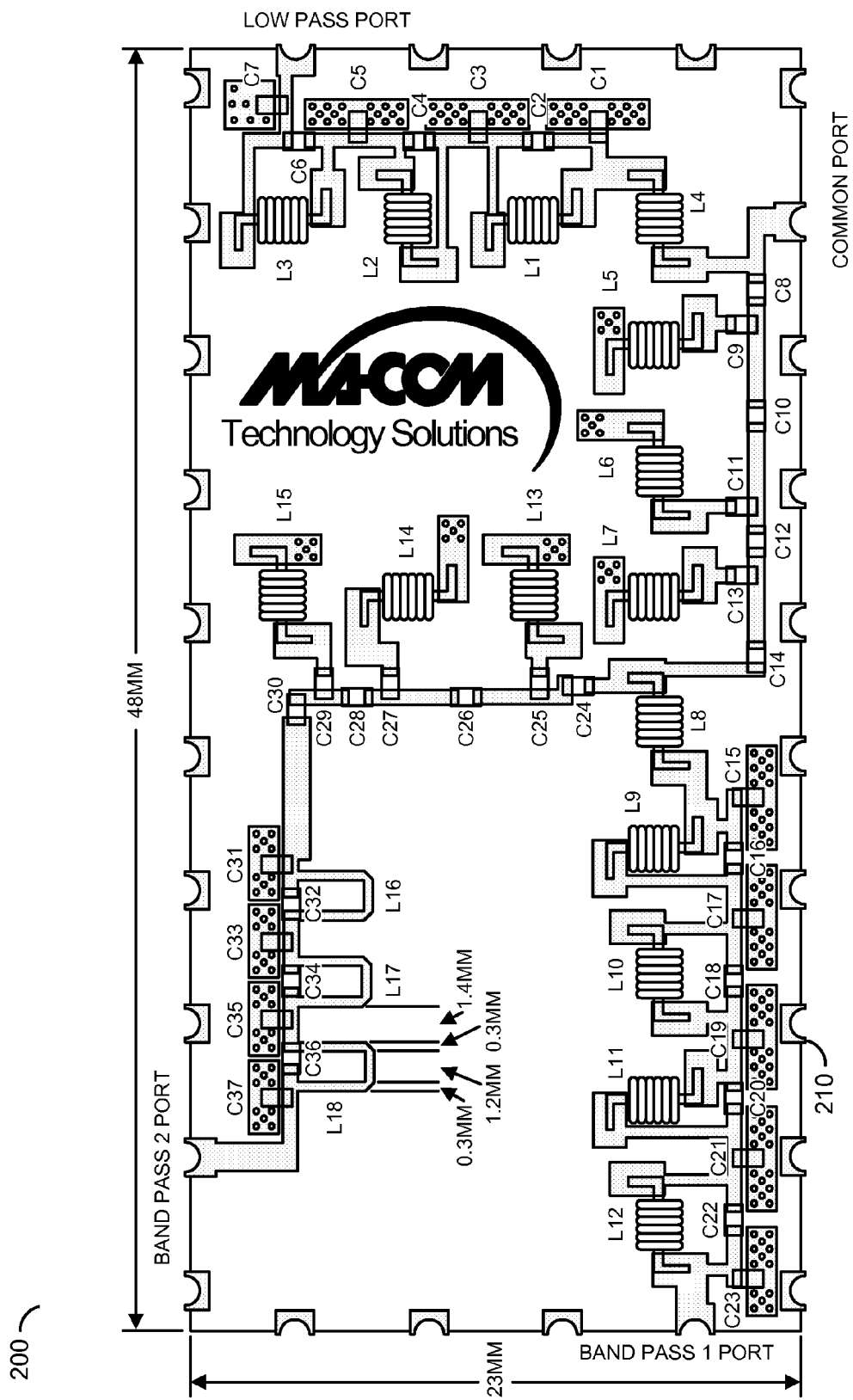
FIG. 5 is a diagram illustrating an example layout pattern for a printed circuit board implementing a triplexer topology in accordance with an example embodiment of the present invention.

Referring to FIG. 5, a diagram is shown illustrating an example layout pattern for a printed circuit board 200 implementing a triplexer in accordance with an example embodiment of the present invention. In one example, the printed circuit board 200 may comprise a two layer, 1.65 mm height, substrate layer. In one example, the substrate layer may comprise a high temperature, high glass transition temperature (Tg), lead free material dielectric constant substrate (e.g., FR4, etc.). A first (or top) metal layer may be patterned to form the interconnections between the filter components and the interconnections from the filters to the input port, the output ports, and ground. A second (or bottom) conductive layer may be a solid metal plane acting as a ground. The metal layers may be implemented using conventional printed circuit board materials (e.g., copper, plated copper, etc.). Vias may connect points of the circuit on the top layer to the bottom ground layer. The printed circuit board 200 may have a number of solder tabs 210 around a periphery of the board. The solder tabs 210 may facilitate mounting the printed circuit board 200 to another printed circuit board (e.g., an end user motherboard, a testing jig, etc.). In one example, the printed circuit board 200 may be shielded (e.g., covered by a metal enclosure, etc.) after being mounted, for example, to the motherboard.

In one example, the circuits 110, 112, 114, 116, and 118 may be implemented with components as summarized in the following TABLE 1:

TABLE 1

| Cap | Value | Cap | Value | Cap | Value | Coil | Desc. |
|---|---|---|---|---|---|---|---|
| C1 | 5.6 pF | C16 | 0.6 pF | C31 | 0.82 pF | L1 | C03115T |
| C2 | 2.2 pF | C17 | 0.9 pF | C32 | 1.0 +/− 0.05 pF | L2 | C03123T |
| C3 | 3.8 pF | C18 | 2.0 pF | C33 | 0.82 pF | L3 | C03116T |
| C4 | 4.7 pF | C19 | 0.1 pF | C34 | 1.0 +/− 0.05 pF | L4 | C03126T |
| C5 | 3.3 pF | C20 | 2.2 pF | C35 | 0.9 pF | L5 | C03126T |
| C6 | 0.3 pF | C21 | 0.75 pF | C36 | 0.4 pF | L6 | C03126T |
| C7 | 1.8 pF | C22 | 0.4 pF | C37 | BLANK | L7 | C03126T |
| C8 | 4.3 pF | C23 | BLANK | | | L8 | C03114T |

TABLE 1-continued

| Cap | Value | Cap | Value | Cap | Value | Coil | Desc. |
|---|---|---|---|---|---|---|---|
| C9 | 3.0 pF | C24 | 2.7 pF | | | L9 | C03116T |
| C10 | 3.0 pF | C25 | 1.2 pF | | | L10 | C04124T |
| C11 | 3.3 pF | C26 | 3.0 pF | | | L11 | C03123T |
| C12 | 10 pF | C27 | 1.6 pF | | | L12 | C04125T |
| C13 | 4.7 pF | C28 | 3.0 pF | | | L13 | C03126T |
| C14 | 3.3 pF | C29 | 3.9 pF | | | L14 | C03115T |
| C15 | 3.9 pF | C30 | 5.6 pF | | | L15 | C04123T |

The capacitors C1-C37 may be implemented using standard 0402 capacitors. The capacitors C1-C37 may be implemented with standard tolerances unless otherwise specified. The capacitors C1-C37 may be implemented as surface mount devices (SMD). The inductors L1-L15 may be implemented as miniature inductor air coils.

Figure 6:
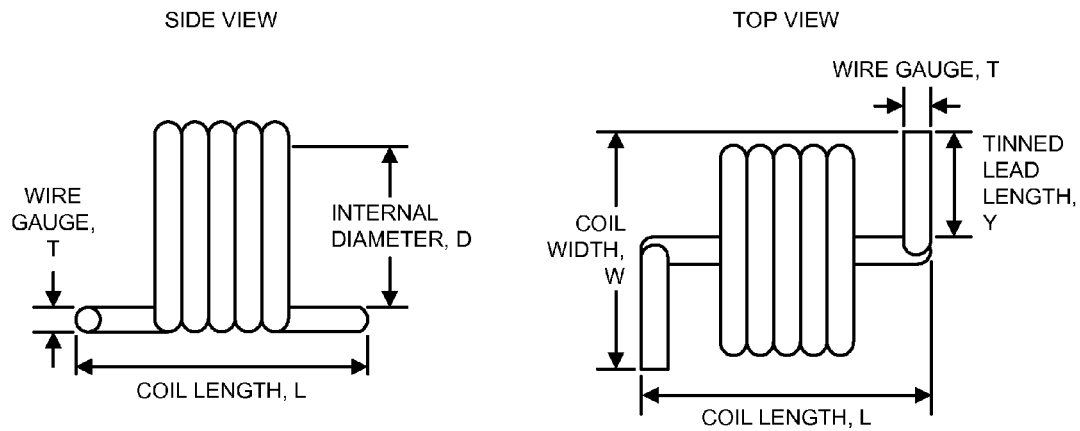
FIG. 6 is a diagram illustrating physical parameters of an example miniature inductor air coil.

Referring to FIG. 6, a diagram illustrating dimensions of an example miniature inductor air coil is shown. Each of the inductors L1-L15 may be implemented, in one example, as a miniature inductor air coil having a coil width (W) of 2.3 mm and a coil length (L) of 3.0 mm. In one example, the miniature inductor air coils may be implemented with coil width and coil length tolerances of, for example, +0.5 mm/−0.2 mm. The coil descriptions shown in TABLE 1 above generally represent physical parameters of the particular miniature inductor air coil implementing the corresponding inductor. For example, the inductor L1 (C03115T) may be implemented as a miniature inductor air coil formed with a wire gauge (T) of 0.3 mm±0.05 mm, an internal diameter (D) of 1.1 mm±0.1 mm, and 5 turns wound clockwise. The inductor L10 (C04124T) may be implemented as a miniature inductor air coil formed with a wire gauge of 0.4 mm±0.05 mm, an internal diameter of 1.2 mm±0.1 mm, and turns wound clockwise. The remaining inductors may be implemented similarly.

Figure 7:
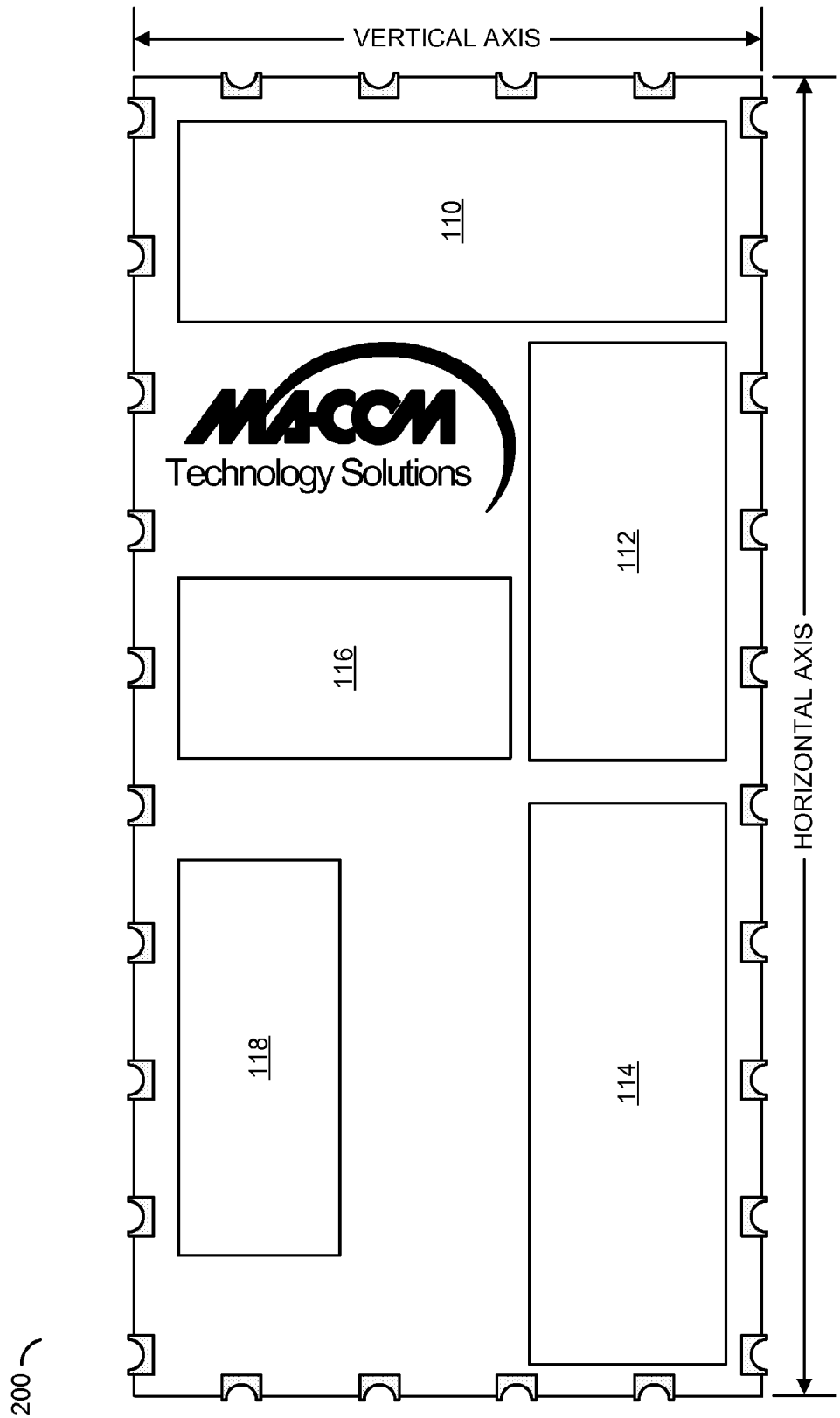
FIG. 7 is a diagram illustrating orthogonal arrangements of filters.

Referring to FIG. 7, a diagram is shown illustrating the orthogonal orientation of the filter circuits on the printed circuit board 200 of FIG. 5. The circuits 110, 112, 114, 116, and 118 are generally laid out orthogonally (at right angles) to one another. For example, the circuits 112 and 114 may be laid out generally along a first (horizontal) axis of the printed circuit board 200 (e.g., horizontally oriented) and the circuits 110 and 116 may be laid out generally along a second (vertical) axis of the printed circuit board 200 (e.g., vertically oriented). When the circuit 118 is implemented, the circuit 118 may be laid out generally perpendicular to the circuit 116 (e.g., horizontally oriented along the first axis). Referring back to FIG. 5, the inductors in each of the circuits 110, 112, 114, and 116 are generally laid out on the printed circuit board such that any two adjacent coils, regardless of which circuit they are a part, are oriented orthogonally (at right angles) to one another with respect to an axis through the windings of the coils. For example, inductor L7 is illustrated as being oriented perpendicularly with respect to inductors L6, L8, and L13.

Figure 8:
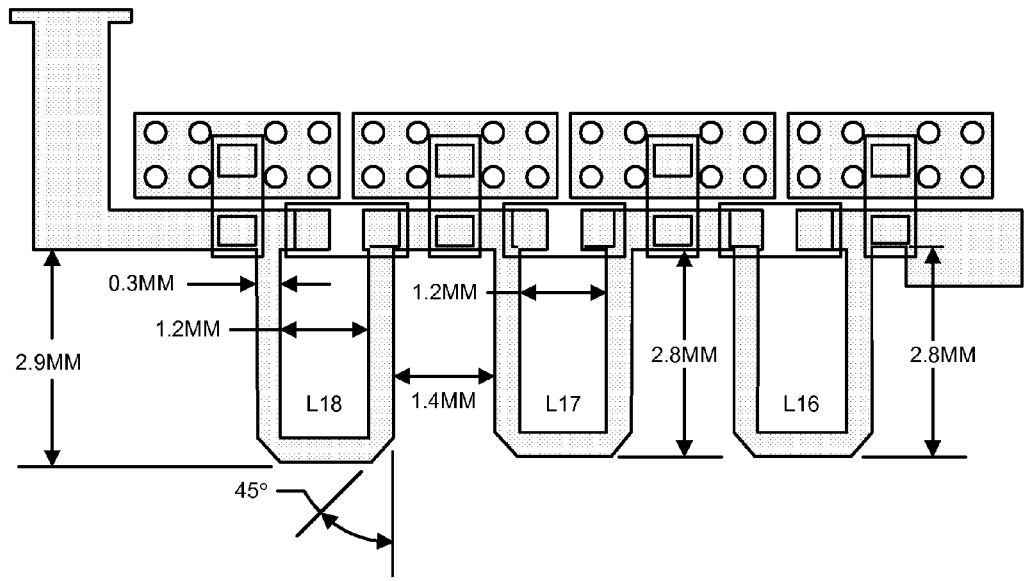
FIG. 8 is a diagram illustrating an example layout for a low pass filter implementing inductors as metal traces rather than wire coils.

Referring to FIG. 8, a diagram is shown illustrating a circuit layout of the circuit 118. In one example, the circuit 118 may be implemented as a low pass filter that presents a high impedance to frequencies above 2.4 GHz. The inductors L16, L17 and L18 of the low pass filter may be implemented as metal traces forming loops. For example, each inductor L16, L17 and L18 may comprise a U shaped metal trace having a metal width of about 0.3 mm, an inner dimension of about 1.2 mm, and a height of about 2.8 mm for inductors L16 and L17 and about 2.9 mm for inductor L18. The inductors L16, L17 and L18 may be spaced 1.4 mm from one another.

The U shaped metal traces of the inductors L16, L17, and L18 may be formed with a 45 degree miter to avoid poor current flow on the loops.

After the triplexer is assembled, the inductors L1-L15 are generally tuned by adjusting (e.g., spreading, etc.) the windings slightly to obtain the desired resonant frequency for the desired performance.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a plurality of filters laid out on a printed circuit board, wherein a respective circuit layout of each of said plurality of filters has a first axis and a second axis and the first axis is longer than the second axis, and the respective circuit layout of each of said plurality of filters is arranged on said printed circuit board such that the first axis of one circuit layout is perpendicular to the first axis of at least one other circuit layout;
a first output port configured to present a first output signal having a first band of frequencies in response to an input signal received at an input port of said plurality of filters;
a second output port configured to present a second output signal having a second band of frequencies in response to said input signal received at said input port of said plurality of filters; and
a third output port configured to present a third output signal having a third band of frequencies in response to said input signal received at said input port of said plurality of filters.

2. The apparatus according to claim 1, wherein said printed circuit board has two layers.

3. The apparatus according to claim 1, wherein each of said plurality of filters comprises a plurality of inductors and said plurality of inductors are laid out on a printed circuit board such that any two adjacent inductors are oriented perpendicularly to one another.

4. The apparatus according to claim 3, wherein each of said plurality of inductors comprise a miniature inductor air coil.

5. The apparatus according to claim 1, wherein said apparatus is part of a triplexer.

6. The apparatus according to claim 1, wherein said apparatus is part of a set-top-box.

7. The apparatus according to claim 1, wherein said plurality of filters comprises:
a first filter comprising a low pass filter having a first bandwidth and configured to generate said first output signal in response to said input signal;
a second filter comprising a high pass filter having a second bandwidth and configured to present an intermediary signal in response to said input signal;
a third filter comprising a low pass filter having a third bandwidth and configured to generate said second output signal in response to said intermediary signal; and
a fourth filter comprising a high pass filter having a fourth bandwidth and configured to generate said third output signal in response to said intermediary signal.

8. The apparatus according to claim 7, wherein said first bandwidth is a subset of said third bandwidth, said fourth bandwidth is a subset of said second bandwidth, and said second and said third bandwidths overlap.

9. The apparatus according to claim 7, wherein each of said first, said second, said third and said fourth filters comprise one or more capacitors and one or more inductors configured to present a high impedance to out-of-band frequencies.

10. The apparatus according to claim 7, further comprising a fifth filter having a fifth bandwidth, wherein said fifth filter is configured to present an output in response to said third output signal.

11. The apparatus according to claim 10, wherein said fifth filter comprises one or more capacitors and one or more inductors configured to present a high impedance to out-of-band frequencies.

12. The apparatus according to claim 10, wherein said fifth filter comprises one or more capacitors and one or more inductors configured to present a high impedance to frequencies above 2.4 GHz.

13. The apparatus according to claim 10, wherein said printed circuit board has two or more layers.

14. The apparatus according to claim 13, wherein each of one or more inductors of said fifth filter is implemented as a metal trace in one of said layers of said printed circuit board.

15. A method of triplexing an input signal comprising:
providing a plurality of filters laid out on a printed circuit board, wherein a respective circuit layout of each of said plurality of filters has a first axis and a second axis and the first axis is longer than the second axis, and the respective circuit layout of each of said plurality of filters is arranged on said printed circuit board such that the first axis of one circuit layout is perpendicular to the first axis of at least one other circuit layout;
receiving said input signal at an input port;
presenting a first band of frequencies of said input signal at a first output port;
presenting a second band of frequencies at a second output port in response to said input signal; and
presenting a third bands of frequencies at a third output port in response to said input signal.

16. The method according to claim 15, wherein each of said plurality of filters comprises a plurality of inductors, each of said plurality of inductors has a first axis that is perpendicular to a set of windings of the inductor, and the inductors are arranged on said printed circuit board such that the first axis of one inductor is perpendicular to the first axis of each adjacent inductor.

17. The method according to claim 16, wherein each of said plurality of inductors comprises a miniature inductor air coil.

18. The method according to claim 16, further comprising adjusting the windings of one or more of the inductors to obtain a predefined resonant frequency.

19. The method according to claim 16, further comprising providing a low pass filter laid out on said printed circuit board, wherein each of a plurality of inductors is formed by a metal trace on said printed circuit board.

20. An apparatus comprising:
means for receiving an input signal;
means for presenting a first band of frequencies of said input signal at a first output port, wherein said means for presenting said first band of frequencies has a first circuit layout comprising a first axis and a second axis, and the first axis is longer than the second axis;
means for presenting a high impedance to said first band of frequencies of said input signal and passing a second band of frequencies of said input signal as an intermediary signal, wherein said means for presenting said high impedance to said first band of frequencies of said input signal and passing said second band of frequencies of said input signal has a second circuit layout comprising a first axis and a second axis, and the first axis is longer than the second axis;

means for presenting a third band of frequencies at a second output port in response to said intermediary signal, wherein said means for presenting said third band of frequencies has a third circuit layout comprising a first axis and a second axis, the first axis is longer than the second axis, and said third band of frequencies comprises a subset of the frequencies of said second band of frequencies of said input signal; and means for presenting a high impedance to said first and said third bands of frequencies and passing a fourth band of frequencies in response to said intermediary signal, wherein said fourth band of frequencies comprises a subset of the frequencies of said second band of frequencies of said input signal, said means for presenting said high impedance to said first and said third bands of frequencies and passing said fourth band of frequencies has a fourth circuit layout comprising a first axis and a second axis, the first axis is longer than the second axis, and the respective circuit layout of each of said presenting means is arranged on a printed circuit board such that the first axis of one circuit layout is perpendicular to the first axis of at least one other circuit layout.

* * * * *